United States Patent
Baloglu et al.

(10) Patent No.: US 9,607,890 B1
(45) Date of Patent: Mar. 28, 2017

(54) STRESS RELIEVING THROUGH-SILICON VIAS

(71) Applicant: Amkor Technology, Inc., Tempe, AZ (US)

(72) Inventors: Bora Baloglu, Chandler, AZ (US); Ronald Patrick Huemoeller, Gilbert, AZ (US)

(73) Assignee: AMKOR TECHNOLOGY, INC., Tempe, AZ (US)

( * ) Notice: Subject to any disclaimer, the term of this patent is extended or adjusted under 35 U.S.C. 154(b) by 0 days.

(21) Appl. No.: 14/082,422

(22) Filed: Nov. 18, 2013

(51) Int. Cl.
| | |
|---|---|
| *H01L 21/4763* | (2006.01) |
| *H01L 29/40* | (2006.01) |
| *H01L 21/768* | (2006.01) |
| *H01L 23/48* | (2006.01) |
| *H01L 23/498* | (2006.01) |

(52) U.S. Cl.
CPC .. *H01L 21/76883* (2013.01); *H01L 21/76814* (2013.01); *H01L 23/481* (2013.01); *H01L 21/76898* (2013.01); *H01L 23/49827* (2013.01); *H01L 2225/06544* (2013.01); *H01L 2225/06555* (2013.01)

(58) Field of Classification Search
CPC . H01L 2225/06541; H01L 2225/06544; H01L 2225/06555; H01L 21/76883; H01L 21/76814; H01L 21/76898; H01L 23/481; H01L 23/49827; H01L 23/49838; H01L 23/5384; H01L 23/5386
See application file for complete search history.

(56) References Cited

U.S. PATENT DOCUMENTS

| | | | | |
|---|---|---|---|---|
| 8,338,957 | B2* | 12/2012 | Nilsson | 257/774 |
| 2005/0074959 | A1* | 4/2005 | Burrell et al. | 438/617 |
| 2007/0290300 | A1* | 12/2007 | Kawakami | 257/621 |
| 2011/0215450 | A1* | 9/2011 | Chi | H01L 23/48 257/660 |
| 2013/0328186 | A1* | 12/2013 | Uzoh | H01L 21/76898 257/737 |

* cited by examiner

*Primary Examiner* — Su C Kim
(74) *Attorney, Agent, or Firm* — McAndrews, Held & Malloy, Ltd.

(57) ABSTRACT

Methods and systems for stress relieving through-silicon vias are disclosed and may include forming a semiconductor device comprising a stress relieving stepped through-silicon-via (TSV), said stress relieving stepped TSV being formed by: forming first mask layers on a top surface and a bottom surface of a silicon layer, forming a via hole through the silicon layer at exposed regions defined by the first mask layers, and removing the first mask layers. The formed via hole may be filled with metal, second mask layers may be formed covering top and bottom surfaces of the silicon layer and a portion of top and bottom surfaces of the metal filling the formed via hole, and metal may be removed from the top and bottom surfaces of the metal exposed by the second mask layers to a depth of less than half a thickness of the silicon layer.

20 Claims, 7 Drawing Sheets

STRESS RELIEVING THROUGH-SILICON VIAS

FIELD

Certain embodiments of the disclosure relate to semiconductor chip packaging. More specifically, certain embodiments of the disclosure relate to a method and system for stress relieving through-silicon vias.

BACKGROUND

Semiconductor packaging protects integrated circuits, or chips, from physical damage and external stresses. In addition, it can provide a thermal conductance path to efficiently remove heat generated in a chip, and also provide electrical connections to other components such as printed circuit boards, for example. Materials used for semiconductor packaging typically comprises ceramic or plastic, and form-factors have progressed from ceramic flat packs and dual in-line packages to pin grid arrays and leadless chip carrier packages, among others.

Further limitations and disadvantages of conventional and traditional approaches will become apparent to one of skill in the art, through comparison of such systems with the present disclosure as set forth in the remainder of the present application with reference to the drawings.

DETAILED DESCRIPTION

Certain aspects of the disclosure may be found in stress relieving through-silicon vias. Example aspects of the disclosure may comprise forming a semiconductor device comprising a stress relieving stepped through-silicon-via (TSV), said stress relieving stepped TSV being formed by: forming first mask layers on a top surface and a bottom surface of a silicon layer, forming a via hole through the silicon layer at exposed regions defined by the first mask layers, and removing the first mask layers. The formed via hole may be filled with metal, second mask layers may be formed covering top and bottom surfaces of the silicon layer and a portion of top and bottom surfaces of the metal filling the formed via hole, and metal may be removed from the top and bottom surfaces of the metal exposed by the second mask layers to a depth of less than half a thickness of the silicon layer. The second mask layers may be removed and regions formed by the metal removing may be filled with a conductive material, which may comprise polysilicon and the metal may comprise copper. The stress relieving stepped TSV may be formed in an interposer and/or an integrated circuit die. The metal may be removed utilizing an etching process or a laser ablating process. A dielectric layer may be formed on sidewalls of the formed via hole before filling with metal. Half of the metal filling the vias may be exposed by the second mask layers.

Figure 1:
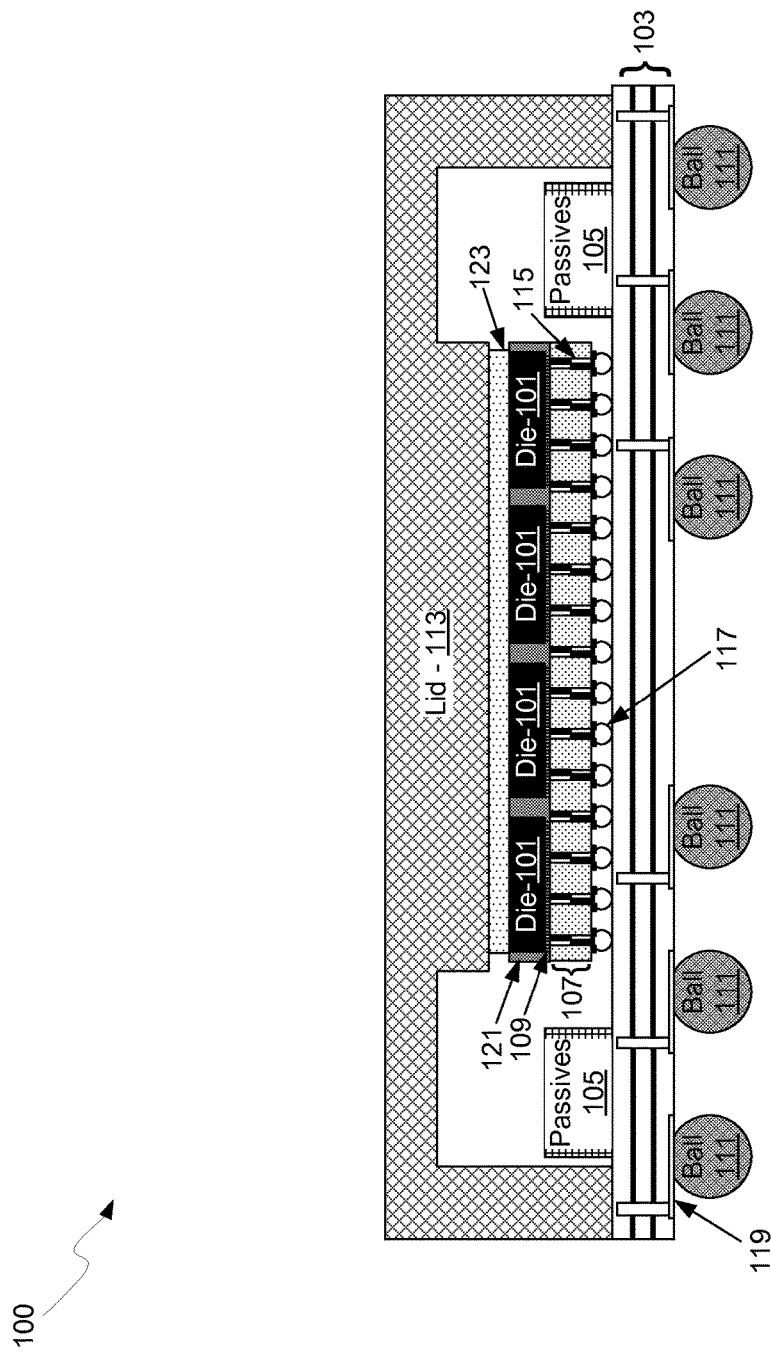
FIG. 1 is a schematic illustrating a semiconductor package utilizing stress-relieving through-silicon vias, in accordance with an example embodiment of the disclosure.

FIG. 1 is a schematic illustrating a semiconductor package utilizing stress-relieving through-silicon vias, in accordance with an example embodiment of the disclosure. Referring to FIG. 1, there is shown a package 100 comprising die 101, a packaging substrate 103, passive devices 105, an interposer 107, solder balls 111, a lid 113, mold compound 121, and thermal interface material 123.

The die 101 may comprise integrated circuit die that have been separated from one or more semiconductor wafers. The die 101 may comprise electrical circuitry such as digital signal processors (DSPs), network processors, power management units, audio processors, RF circuitry, wireless baseband system-on-chip (SoC) processors, sensors, memory, and application specific integrated circuits, for example. In addition, the die 101 may comprise micro-bumps 109 for providing electrical contact between the circuitry in the die 101 and contact pads on the surface of the interposer 107.

Figure 2A:
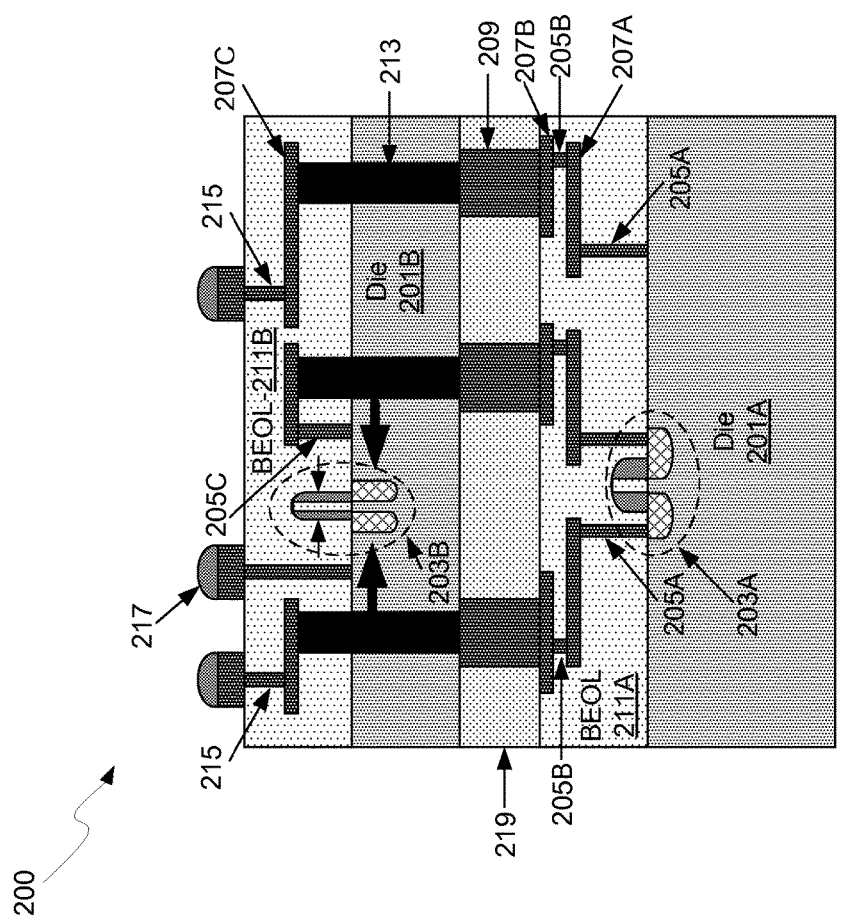
FIGS. 2A and 2B illustrate the effects of thermal mismatch in a semiconductor package, in accordance with an example embodiment of the disclosure.
Figure 2B:
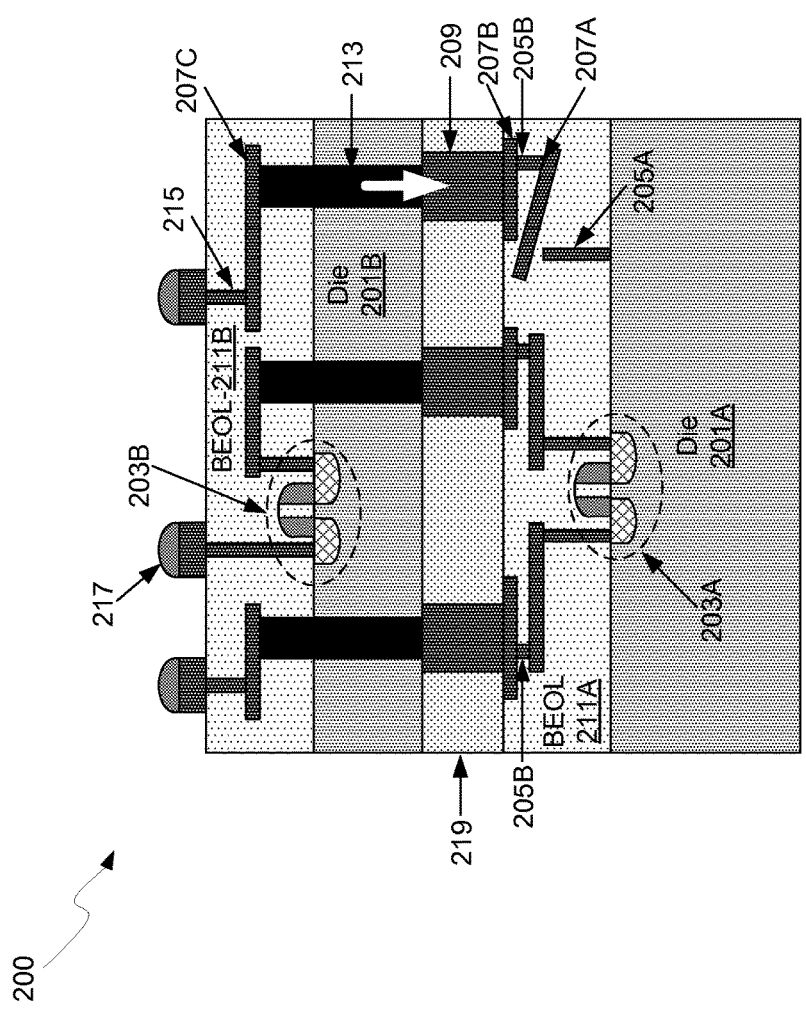

The interposer 107 may comprise a semiconductor substrate separated from a wafer, such as a silicon wafer, with through-silicon-vias (TSVs) 115 that provide electrically conductive paths from one surface of the interposer 107 to the opposite surface. TSVs may typically be cylindrical in shape and made from copper, or similar metal, that has a different coefficient of thermal expansion (CTE) than the surrounding silicon. This difference in CTE may result in stress in the silicon, which may affect the performance of nearby devices, such as when the TSVs are in a semiconductor die, or the electrical continuity of interconnects, such as when the TSVs are near redistribution layers in an interposer, for example, as illustrated in FIGS. 2A and 2B.

In an example scenario, the TSVs 115 may comprise stress-relieving features that may comprise portions removed in both the top and bottom halves of the TSV and backfilled with a material, such as polysilicon, for example. In this manner, displacement caused by different material CTEs may be absorbed by the features in the TSVs 115.

The interposer 107 may also comprise backside bumps 117 for making electrical and mechanical contact to the packaging substrate 103. In another example scenario, the interposer 107 may comprise glass or an organic laminate material, either of which may be capable of large panel formats on the order of 500×500 mm, for example.

The packaging substrate 103 may comprise a mechanical support structure for the interposer 107, the die 101, the passive devices 105, and the lid 113. The packaging substrate 103 may comprise solder balls 111 on the bottom surface for providing electrical contact to external devices and circuits, for example. The packaging substrate 103 may also comprise conductive traces in a non-conductive material for providing conductive paths from the solder balls to the die 101 via pads that are configured to receive the backside bumps 117 on the interposer 107. Additionally, the packaging substrate 103 may comprise pads 119 for receiving the solder balls 111. The pads 119 may comprise one or more under-bump metals, for example, for providing a proper electrical and mechanical contact between the packaging substrate 103 and the solder balls 111.

The passive devices 105 may comprise electrical devices such as resistors, capacitors, and inductors, for example, which may provide functionality to devices and circuits in the die 101. The passive devices 105 may comprise devices that may be difficult to integrate in the integrated circuits in the die 101, such as high value capacitors or inductors. In another example scenario, the passive devices 105 may comprise one or more crystal oscillators for providing one or more clock signals to the die 101.

The lid 113 may provide a hermetic seal for the devices within the cavity defined by the lid 110 and the packaging substrate 103. A thermal interface may be created for heat transfer out of the die 101 to the lid 113 via the thermal interface material 123, which may also act as an adhesive.

FIGS. 2A and 2B illustrate the effects of thermal mismatch in a semiconductor package, in accordance with an example embodiment of the disclosure. Referring to FIG. 2A, there is shown a semiconductor package 200 comprising semiconductor die 201A and 201B, back end of line (BEOL) 211A and 211B, and a bonding layer 219. The die 201A may comprise an integrated circuit die with electronic devices, such as the CMOS transistor 203A, and the die 201B may comprise a CMOS device 203B. Only one device is shown for thermal strain illustrative purposes, as the die 201A and 201B may comprise electrical circuitry such as digital signal processors (DSPs), network processors, power management units, audio processors, RF circuitry, wireless baseband system-on-chip (SoC) processors, sensors, memory, and application specific integrated circuits, for example.

The BEOL 211A and 211B may comprise interconnect layers, such as redistribution layers 207A-207C, buried vias 205A-205C, and blind vias 215. The redistribution layers 207A and 207B, buried vias 205A-205C, and blind vias 215 may provide electrical connectivity between devices in the semiconductor die 201A and devices in other structures, such as the die 201B, or external to the semiconductor package 200 for example.

The bonding layer 219 may comprise an adhesive layer that bonds the die 201A/BEOL 211A to the die 201B/BEOL 211B, and may comprise conductive pillars 209 to provide electrical connection between the die/BEOL structures. The conductive bumps 217 may comprise metal bumps or solder balls, for example, for bonding the semiconductor package 200 to another structure such as a substrate or circuit board.

The die 201B may comprise TSVs 213 for providing an electrical interconnect through the die 201B from the conductive pillars 209 to the redistribution layers 207C in the BEOL 211B. In an example scenario, the silicon in the die 201B has a different CTE than the copper in the TSVs 213, such that when the die 201B heats up in operation or due to the environment, thermal stresses in the lateral direction, as illustrated by the wide arrows extending from the TSVs 213, may affect performance of nearby devices. For example, the CMOS device 203B may be compressively strained due to the laterally expanding TSVs 213, as shown by the reduced width of the CMOS device 203B, exaggerated for illustrative purposes, compared to the unstrained CMOS device 203A.

This strain from different CTEs may result in carrier mobility variations, which may be different for p- and n-type material and in different directions from the TSVs, and threshold voltage variations in nearby semiconductor devices. Thus, even if the CMOS devices 203A and 203B were nominally identical in design and manufacturing, the CMOS device 203B may have different performance when thermal shifts cause strain from the TSVs 213.

FIG. 2B illustrates the semiconductor package 200, with the semiconductor die 201A and 201B, BEOL 211A and 211B, and bonding layer 219, but demonstrates strain in the vertical direction. For example, the electrical interconnections provided by the buried vias 205A and 205B and the redistribution layers 207A and 207B may be physically impaired by the strain due to thermal expansion. In an example scenario, the expansion of the TSVs with temperature, as illustrated by the white downward-pointing arrow, may push on the conductive pillar 209, the redistribution layer 207B, the blind via 205B, and the redistribution layer 207A, causing an open circuit at the intersection with the blind via 205A.

In an example scenario, stress-relieving TSVs may be utilized to absorb the mechanical strain cause by different CTEs of the semiconductor and metal layers in the semiconductor package 200. For example, in forming the TSVs 213, metal may be partially removed from the top and bottom and backfilled with another material, resulting in a structure that is capable of absorbing mechanical strain, reducing or eliminating strain on nearby electronic devices and/or electrical interconnects.

Figure 3:
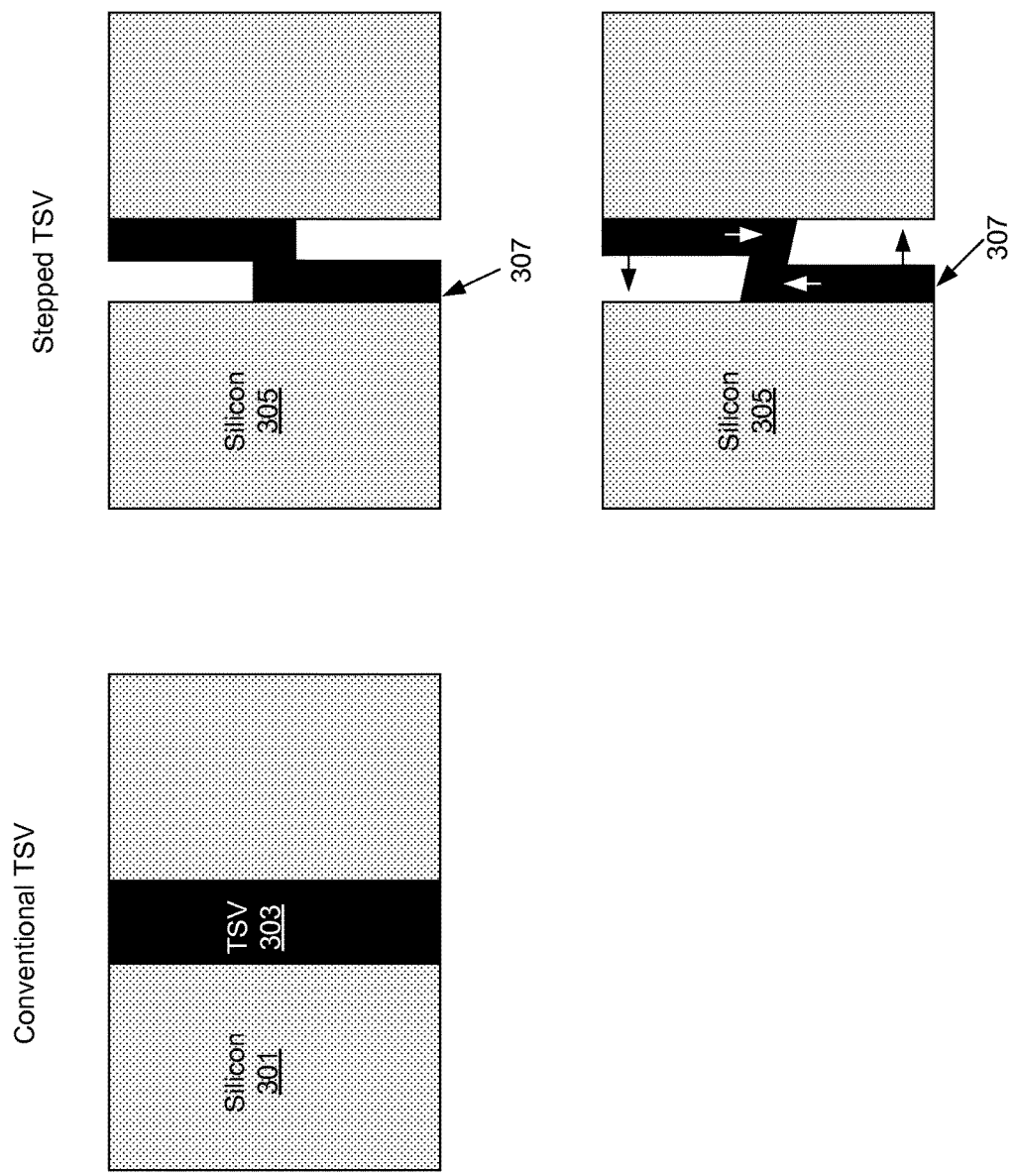
FIG. 3 illustrates a conventional through-silicon via and a stress relieving through-silicon via, in accordance with an example embodiment of the disclosure.

FIG. 3 illustrates a conventional through-silicon via and a stress relieving through-silicon via, in accordance with an example embodiment of the disclosure. Referring to FIG. 3, there is shown a conventional TSV 303 formed in the silicon layer 301 and a stress-relieving TSV 307 formed in a silicon layer 305.

The conventional TSV 303 comprises a copper layer in a silicon layer 301, which may comprise a silicon substrate. The different CTEs of silicon and copper may cause physical strain in the vicinity of the TSV 303 due to thermal expansion or contraction. Expansion of the conventional TSV 303 may result in lateral strain in the silicon layer 301 and vertical strain into structures coupled to the TSV 303.

The stress relieving TSV 303 may comprise a stepped structure, with material partially removed from the top and bottom of the TSV 303. The stepped structure may be operable to absorb physical strain from thermal expansion since the remaining metal portion may move within the space created by the removed metal, as illustrated by the arrows in the lower right figure. In an example scenario, In addition, a different material may be backfilled in the removed portion, as illustrated in FIGS. 4A-4F.

Figures 4A, 4B, 4C, 4D:
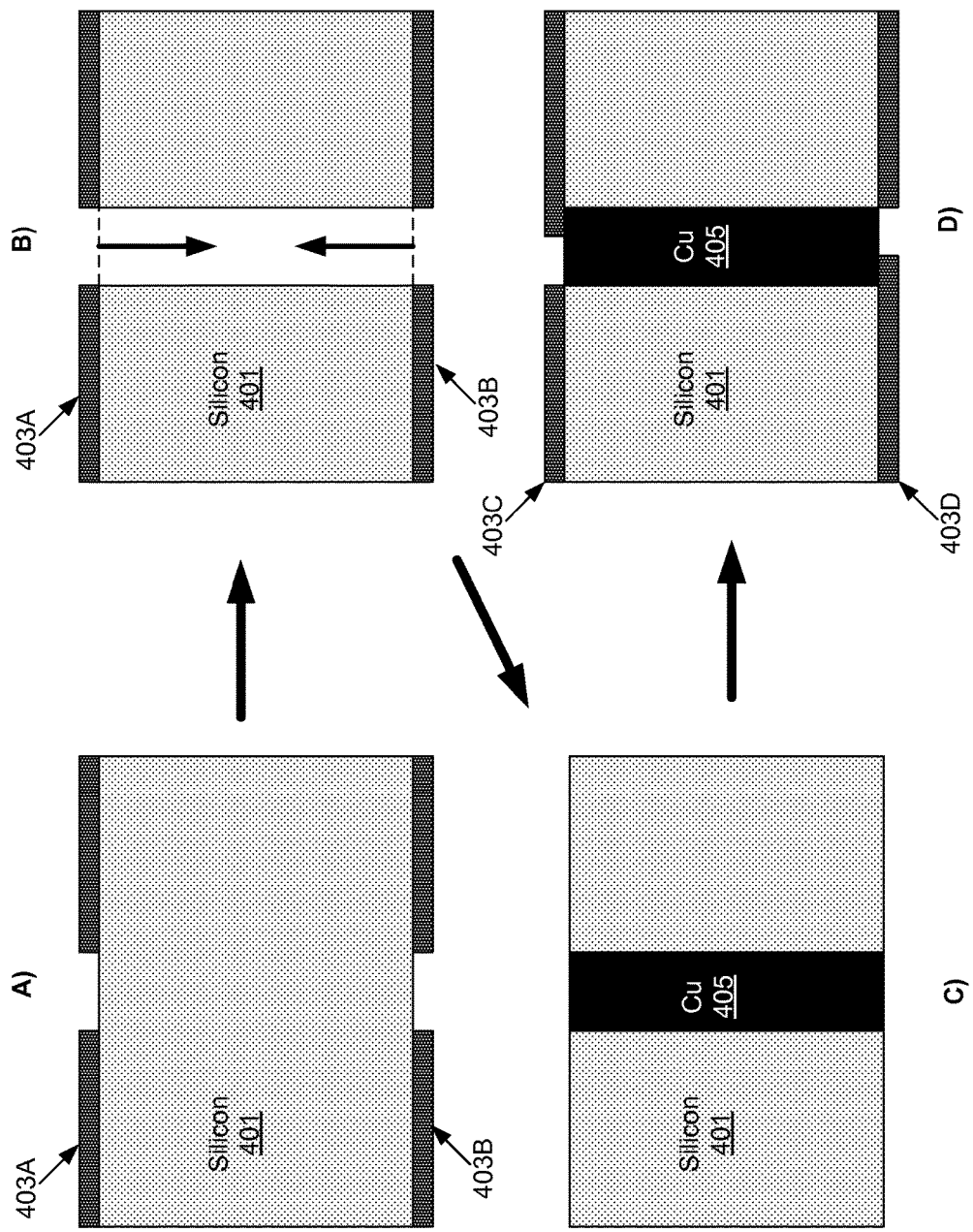
FIGS. 4A-4F illustrate a process of forming a stress relieving through-silicon via, in accordance with an example embodiment of the disclosure.

FIGS. 4A-4F illustrate a process of forming a stress relieving through-silicon via, in accordance with an example embodiment of the disclosure. The large arrows indicate the process flow from FIG. 4A to 4D. Referring to FIG. 4A, there is shown a silicon layer 401 and mask layers 403A and 403B. The silicon layer 401 may comprise an integrated circuit die or an interposer, for example. The mask layers 403A and 403B may comprise a patterned photoresist layer, or other suitable mask material for the desired etching process, formed by photolithography techniques, for example.

The silicon layer 401 may then be etched all the way through forming a via hole using an etching or ablating process, for example. The dashed lines in FIG. 4B illustrate that while the etching or ablating process extends all the way through the silicon layer 401, it is only in regions where TSVs are to be formed, i.e., the silicon layer 401 is not separated into two wholly separate parts.

The mask layers 403A and 403B may be removed and the removed portion of the silicon layer 401 may then be filled with metal, such as with copper layer 405, in a plating or deposition process, for example, as illustrated in FIG. 4C. In another example scenario, a thin dielectric layer may be formed on the etched sidewalls prior to filling with metal. Second mask layers 403C and 403D may then be formed on the top and bottom surfaces of the silicon layer 401 to cover a portion of the copper layer 405, as shown in FIG. 4D.

While a copper layer is shown in FIGS. 4C-4F, other metals suitable for TSVs may be utilized.

Figures 4E, 4F:
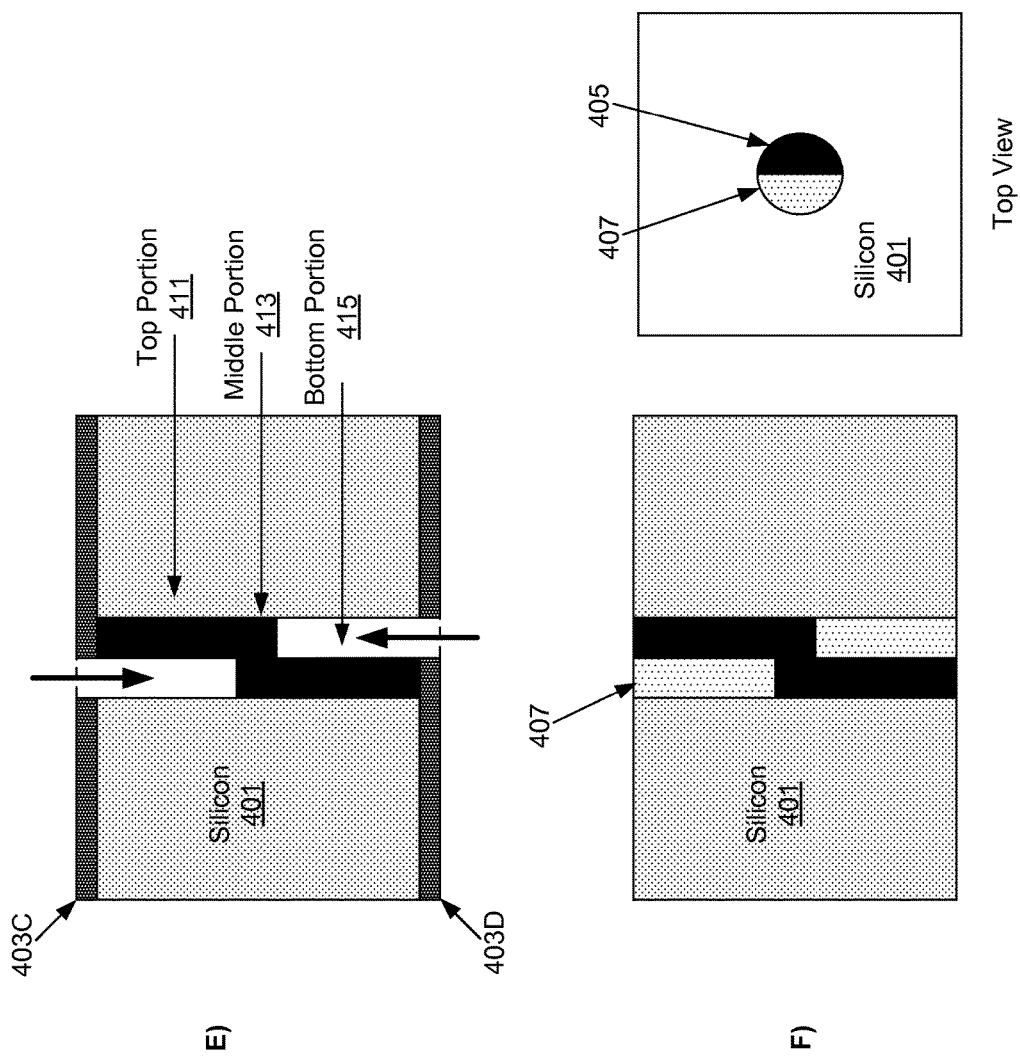

The exposed portions of the copper layer 405 may be removed less than or equal to half the depth of the silicon layer from the top and bottom surfaces, resulting in the stepped structure with the top portion 411, middle portion 413, and bottom portion 415 illustrated in FIG. 4E. The copper may be removed by an etching or laser ablating process, for example. Finally, the removed portion of the copper layer 405 may then be backfilled with a filler material 407, which may comprise polysilicon, for example. The filler material 407 may comprise a conductive material to ensure a low resistivity despite the reduced copper thickness. In addition, the filler material 407 may be selected to absorb any expansion of the remaining copper layer 405 or to provide a different CTE material in the TSV. In an alternative scenario, the filler material 407 may comprise a non-conductive material selected for its strain-absorbing properties.

The right view in FIG. 4F is a top view of the remaining copper layer 405 and the filler material 407, both within the silicon layer 401. In this example, a cylindrical structure is shown, although other shapes may be utilized. Note that a single step is shown and discussed for illustrative clarity, but a multi-step TSV structure may also be formed, for example using additional etching and/or filling steps.

Figure 5:
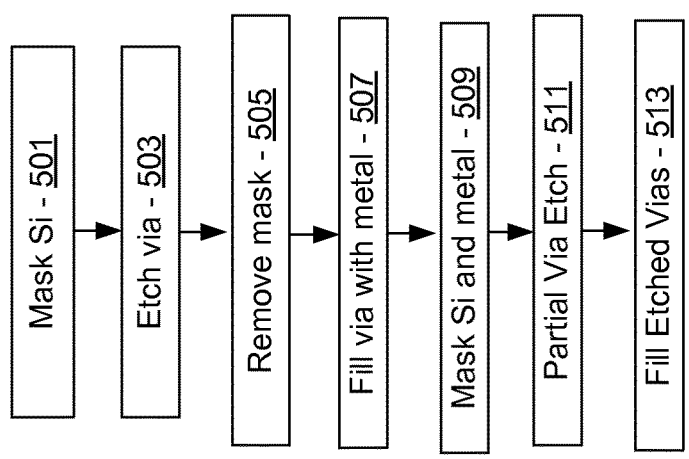
FIG. 5 illustrates example steps in fabricating a stress-relieving through-silicon via, in accordance with an example embodiment of the disclosure.

FIG. 5 illustrates example steps in fabricating a stress-relieving through-silicon via, in accordance with an example embodiment of the disclosure. In the first step 501, a mask layer may be formed on top and bottom surfaces of the silicon layer, followed by step 503, where the exposed regions of the silicon layer may be etched through forming a via hole.

In step 505, the mask layers may be stripped, followed by step 507 where the removed regions may be filled with metal, or alternatively first covered with a thin dielectric layer followed by filling with metal.

In step 509, the silicon layer and filled vias may be masked on top and bottom surfaces, exposing a portion of the metal. In step 511, the metal may be removed in the exposed regions to a depth less than half of the silicon layer, leaving a stepped via structure, followed by step 513 where the etched vias may be filled with a polysilicon material, for example.

In an embodiment of the disclosure, a method is disclosed for stress relieving through-silicon vias. In this regard, aspects of the disclosure may comprise forming a semiconductor device comprising a stress relieving stepped through-silicon-via (TSV), said stress relieving stepped TSV being formed by: forming first mask layers on a top surface and a bottom surface of a silicon layer, forming a via through the silicon layer at exposed regions defined by the first mask layers, and removing the first mask layers.

The formed via hole may be filled with metal, second mask layers may be formed covering top and bottom surfaces of the silicon layer and a portion of top and bottom surfaces of the metal filling the formed via hole, and metal may be removed from the top and bottom surfaces of the metal exposed by the second mask layers to a depth of less than half a thickness of the silicon layer. The second mask layers may be removed and regions formed by the metal removing may be filled with a conductive material, which may comprise polysilicon and the metal may comprise copper.

The stress relieving stepped TSV may be formed in an interposer and/or an integrated circuit die. The metal may be removed utilizing an etching process or a laser ablating process. A dielectric layer may be formed on sidewalls of the formed via before filling with metal. Half of the metal filling the formed via hole may be exposed by the second mask layers.

In an embodiment of the disclosure, a device is disclosed for stress relieving through-silicon vias. In this regard, aspects of the disclosure may comprise a stress relieving stepped through-silicon-via (TSV) in a silicon layer, the stress relieving stepped TSV comprising: a via hole formed through the silicon layer, metal partially filling a first region of the formed via hole to a depth that is less than half the thickness of the silicon layer from a top surface of the silicon layer, and metal partially filling a second region of the formed via hole to a depth that is less than half the thickness of the silicon layer from a bottom surface of the silicon layer.

A cross-section of the first region of the formed via hole partially filled from the top surface of the silicon layer is within half of a cross-sectional area of the stress relieving stepped TSV while a cross-section of the second region of the formed via hole filled from the bottom surface of the silicon layer is within an opposite half of the cross-sectional area of the stress relieving stepped TSV. Regions of the formed via hole not filled by metal may be filled with a second conductive material.

The second conductive material may comprise polysilicon and the metal may comprise copper. The stress relieving stepped TSV may be formed in an interposer and/or an integrated circuit die. A dielectric layer may be formed between the metal and sidewalls of the formed via hole. A cross-section of the stress-relieving stepped TSV may be circular. A cross-section of the first region of the formed via hole may comprise a first half of the circular cross-section of the stress relieving stepped TSV and a cross-section of the second region of the formed via hole may comprise a second half of the circular cross-section of the stress relieving stepped TSV.

While the disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiments disclosed, but that the present disclosure will include all embodiments falling within the scope of the appended claims.

What is claimed is:

1. A method for semiconductor packaging, the method comprising:
    forming a semiconductor device comprising a stepped through-silicon-via (TSV), said stepped TSV being formed, at least in part, by:
        providing a via hole through a silicon layer;
        filling the via hole with metal; and
        removing, from within the via hole, a portion of the metal in the via hole from top and bottom surfaces of the metal to a depth of less than half a thickness of the silicon layer;
    wherein said removing comprises:
        removing the metal from the top surface in a first cross-sectional area of the via hole while retaining the metal from the top surface in a second cross-sectional area of the via hole opposite the first cross-sectional area; and removing the metal from the bottom surface in the second cross-sectional area of the via hole while retaining the metal from the bottom surface in the first cross-sectional area.

2. The method according to claim 1, comprising filling regions formed by the metal removing with a conductive material.

3. The method according to claim 2, wherein the conductive material comprises polysilicon.

4. The method according to claim 1, wherein the metal comprises copper.

5. The method according to claim 1, comprising forming the stepped TSV in an interposer.

6. The method according to claim 1, comprising forming the stepped TSV in an integrated circuit die.

7. The method according to claim 1, comprising removing the portion of the metal from within the via hole utilizing an etching process.

8. The method according to claim 1, comprising removing the portion of the metal from within the via hole utilizing a laser ablating process.

9. The method according to claim 1, comprising forming a dielectric layer on sidewalls of the via hole before filling with metal.

10. The method according to claim 1, wherein the metal filling a middle portion of the via hole comprises a step structure.

11. A semiconductor device comprising:
a stepped through-silicon-via (TSV) in a silicon layer, the stepped TSV comprising:
a via hole that extends through the silicon layer, where the via hole comprises a top portion, a middle portion and a bottom portion along the longitudinal axis of the via hole; and
a metal that extends longitudinally through the via hole;
wherein the metal partially fills the top and bottom portions of the via hole less than the metal fills the middle portion of the via hole;
wherein the metal in the top portion is within a first half of a cross-sectional area of the via hole and not in an opposite second half of the cross-sectional area of the via hole; and
wherein the metal in the bottom portion is within the opposite second half of the cross-section area of the via hole and not in the first half of the cross-sectional area of the via hole.

12. The semiconductor device according to claim 11, wherein regions of the via hole not filled by metal are filled with a filler material.

13. The semiconductor device according to claim 12, wherein the filler material comprises polysilicon.

14. The semiconductor device according to claim 11, wherein the metal comprises a step structure in the middle portion of the via hole.

15. The semiconductor device according to claim 11, wherein the stepped TSV is in an interposer.

16. The semiconductor device according to claim 11, wherein the stepped TSV is in an integrated circuit die.

17. The semiconductor device according to claim 11, wherein a dielectric layer is between the metal and sidewalls of the via hole.

18. The semiconductor device according to claim 11, wherein a cross-section of the via hole is circular.

19. The semiconductor device according to claim 11, wherein the top and bottom portions are generally the same size and larger in the longitudinal direction than the middle portion.

20. A semiconductor device comprising:
a circular cross-section stepped via in a layer, the stepped via comprising:
a via hole that extends through the layer, where the via hole comprises a top cylindrical portion, a middle cylindrical portion and a bottom cylindrical portion along the longitudinal axis of the via hole; and
a metal that extends longitudinally through the via hole;
wherein the metal partially fills the top and bottom cylindrical portions of the via hole less than the metal fills the middle cylindrical portion of the via hole;
wherein the metal in the top cylindrical portion is within a first half of a cross-sectional area of the via hole and not in an opposite second half of the cross-sectional area of the via hole; and
wherein the metal in the bottom cylindrical portion is within the opposite second half of the cross-section area of the via hole and not in the first half of the cross-sectional area of the via hole.

* * * * *